United States Patent [19]

Bosiers

[11] Patent Number: 5,223,727
[45] Date of Patent: Jun. 29, 1993

[54] CHARGE-COUPLED DEVICE HAVING AN IMPROVED ELECTRODE STRUCTURE

[75] Inventor: Jan Th. J. Bosiers, Eindhoven, Netherlands

[73] Assignee: U.S. Philips Corp., New York, N.Y.

[21] Appl. No.: 858,261

[22] Filed: Mar. 26, 1992

[30] Foreign Application Priority Data

Mar. 29, 1991 [EP] European Pat. Off. ........ 91200755.6

[51] Int. Cl.$^5$ ..................... H01L 29/78; H01L 27/14; H01L 31/00
[52] U.S. Cl. .................................. 257/250; 257/222; 257/224; 257/231; 257/243
[58] Field of Search ............... 357/24 LR, 24; 377/61, 377/62, 63; 358/213.23, 213.26, 213.27; 257/222, 224, 231, 243, 250

[56] References Cited

U.S. PATENT DOCUMENTS 4,246,591 1/1981 Kosonocky et al. .......... 357/24 LR
4,987,466 1/1991 Shibata et al. ................. 357/24 LR

OTHER PUBLICATIONS

"A ⅔ 1188(H) 484(V) Frame-Transfer CCDE For ESP and Movie Mode" Bosiers et al. I.E.D.M. Washington, Dec. 1988 pp. 70-73.

Primary Examiner—Andrew J. James
Assistant Examiner—Ngan Van Ngo
Attorney, Agent, or Firm—Steven R. Biren

[57] ABSTRACT

A charge-coupled device includes a parallel section of parallel channels which are situated next to one another and are mutually separated by limitation zones, and a single readout register coupled thereto. The readout register is provided with clock electrodes in a multi-layer wiring system, the electrodes of the upper layer belonging to a common phase and being constructed as a continuous track which extends over the other electrodes. In the bottom wiring layer, electrodes are formed which are each associated with a limitation zone between the parallel channels and which have a length which is at most equal to the width of the limitation zones, and which also belong to a common phase, so that narrow-channel effects are avoided. The invention is of particular importance for CCD image sensors.

6 Claims, 3 Drawing Sheets

CHARGE-COUPLED DEVICE HAVING AN IMPROVED ELECTRODE STRUCTURE

BACKGROUND OF THE INVENTION

The invention relates to a charge-coupled device having a semiconductor body with, at surface, a parallel section of parallel channels situated next to one another and a parallel-in/serial-out register coupled thereto, the parallel channels being mutually separated by limitation zones which extend between the parallel channels up to the serial register, while the serial register is provided with a system of clock electrodes constructed in a multi layer (m-layer) wiring system. The invention also relates to a camera provided with such a device.

Charge-coupled devices with parallel-serial transitions are present, for example, in image sensors in which information, which is stored in the form of charge packages in the parallel section, is transported line by line to the serial register and is sequentially read out at the output of the serial register for further processing. Such parallel-serial combinations are also often used in memories, for example, in SPS memories.

A device of the kind described in the opening paragraph is known from inter alia U.S. Pat No. 4,236,830. This reference discloses various parallel-serial transitions in which the parallel channels have a uniform width over their entire length, up to the serial register. The serial register is constructed as a multiphase register in which the width of the clock electrodes is so chosen that the pitch in the parallel section corresponds to a group of clock electrodes belonging t these phases. This renders it possible to put a row of charge packages simultaneously parallel in the serial register and subsequently to transport these charge packages further through the serial register by means of multiphase clocks. During the parallel-serial transport, the clock electrodes of the serial register which lie in the extension (seen at the surface) of the limitation zones between the parallel channels can be provided with a blocking voltage level while the other clock electrodes are set at an active level, so that charge can be stored below these latter electrodes.

In image sensors which are now know, the serial register includes two or three-sub-registers next to one another with lateral connections between the sub-registers. During the parallel-serial transport the charge packages of one row in the parallel section are distributed over the sub-registers via the lateral connections and then transported to a readout member through the sub-registers. This subdivision of the serial register has become attractive as a result of the ever-decreasing pitch of the parallel section which renders a high horizontal resolution possible in the recording section of the sensor, but which is no longer compatible with the pitch of the electrodes in the serial register. The use of such a composite serial register, however, is also accompanied by drawbacks. Thus it was found inter alia that the distribution of the charge over two or three-sub-registers within fixed, short time intervals is highly critical and often not optimum, and can to a comparatively high degree contribute to the so-called F.P.N. (Fixed Pattern Noise). This is intensified by the fact that the sub-registers are usually provided with separate output amplifiers which will not be entirely identical. Moreover, the parallel-serial transport requires a fairly intricate clock diagram.

SUMMARY OF THE INVENTION

The invention has for its object to provide a device in such a way that a single serial output register can suffice, in the case of very small dimensions in horizontal direction in the parallel section, while good transport characteristics are maintained.

According to the invention, a charge-coupled device of the kind described above is characterized in that the clock electrodes provided in the $m^{th}$, upper wiring layer belong to a common phase of the serial register and form part of a continuous conductor layer which extends over the other clock electrodes and is insulated therefrom, and in that a clock electrode is associated with each of the said limitation zones which clock electrode is provided in the first, lowest wiring layer and which, seen at the surface, lies in the extension of the limitation zone and has a length which is at most equal to the width of the limitation zone, these clock electrodes also belonging to a common phase of the serial register. The use of a multilayer wiring renders it possible to form the electrodes in an overlapping manner, as is known, As used herein, the terms m-layer wiring system and $m^{th}$ wiring layer refer to a multi-layer (i.e. 2 or greater) wiring system having m layers, with the $m^{th}$ layer being uppermost. While the present invention is illustratively embodied in a three-layer wiring system, other numbers of layers are clearly within the scope of the invention. When the lowest or first wiring layer is provided, the configuration is in general still fairly plane, so that it is possible to form electrodes in this layer with a fairly high accuracy. This layer, accordingly, is particularly suitable for forming the electrodes which must be accurately aligned relative to the limitation zones, which are usually very narrow. If these electrodes furthermore are so designed that the edges of the electrodes do not project outside the edges of the channel limitation zones, it can be prevented that potential barriers are crated at the parallel-serial transition a result of narrow-channel effects, which barriers could hamper the charge transport. In addition, since the electrodes in the upper layer, i.e. the layer designated as the last layer, are provided as a continuous layer, these electrodes are not defined by a mask, neither are the distances between the electrodes. Since the dimensions can be very small, for example, of the order of one micron, and the structure with overlapping electrodes i usually far from plane at this stage of the process, the definition of the electrodes in the last wiring layer is often a fairly critical step which is advantageously avoided in that the electrodes are designed as a continuous layer. Only those portions of this layer which are separated by a thin gate dielectric between the remaining electrodes function as electrodes. The intermediate portions of the layer are separated from the surface of the semiconductor body by the other electrodes are not accordingly not active.

A favorable embodiment is characterized in that the continuous conductor layer in the upper conductor layer comprises a portion which is situated above a portion of the parallel section adjoining the serial register.

An important embodiment of a device according to the invention is characterized in that the serial register is an m-phase (i.e. multi-phase) device in which clock electrodes which are provided in a common wiring layer belong to a same phase. Although it may be advantageous under certain conditions to choose the number of wiring layers to be unequal to the number of phases, for example a 4-phase CCD in 3-layer polycrystalline silicon, this embodiment has the advantage inter alia that all electrodes at one side of the serial register can be connected via clock lines without extra crossings.

BRIEF DESCRIPTION OF THE DRAWINGS

The invention will be explained in more detail with reference to an embodiment and the accompanying diagrammatic drawing, in which.

Figure 1:
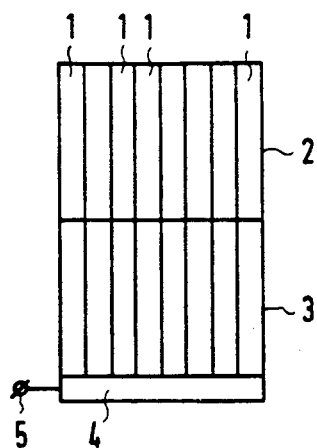
FIG. 1 diagrammatically hows an image sensor of the raster transfer type according to the invention.

It should be noted that the drawing is diagrammatic and not drawn to scale and that in particular the dimensions in vertical direction, transverse to the surface of the semiconductor body, are presented enlarged in related to the dimensions in horizontal direction.

DESCRIPTION OF THE PREFERRED EMBODIMENTS

The device of FIG. 1 is of a generally known type in which the invention is incorporated and comprises a system of CCD channels 1 situated next to one another, which form an image sensing section 2 and a memory section 3. A serial output register 4 is coupled to the outputs of the parallel channels via a parallel-serial transition. The device of FIG. 1 can be used for recording moving pictures. The invention, however, is also applicable in image sensors for still pictures (electronic still picture, e.s.p.) which can be obtained, for example, in that a horizontal readout register is included between the image sensing section 2 and the memory section 3 in the sensor of FIG. 1. For a more detailed description of such a sensor, reference is made to the publication "A ⅔ 1188(H)* 484(V)FRAME-TRANSFER CCD FOR ESP AND MOVIE MODE" by Bosiers et. al., I.E.D.M. Washington, Dec. 1988, pp. 70–73.

The operation of charge-coupled image sensors of the raster transfer type is generally known. An image projected onto the sensing section is converted into a pattern of charge packages during an integration period. After the integration period, this charge pattern is transported at high speed into the memory section 3 which is screened from incident radiation. The lines of the stored charge pattern are then transported one by one into the serial register 4, and read out package by package through the output 5.

Figure 2:
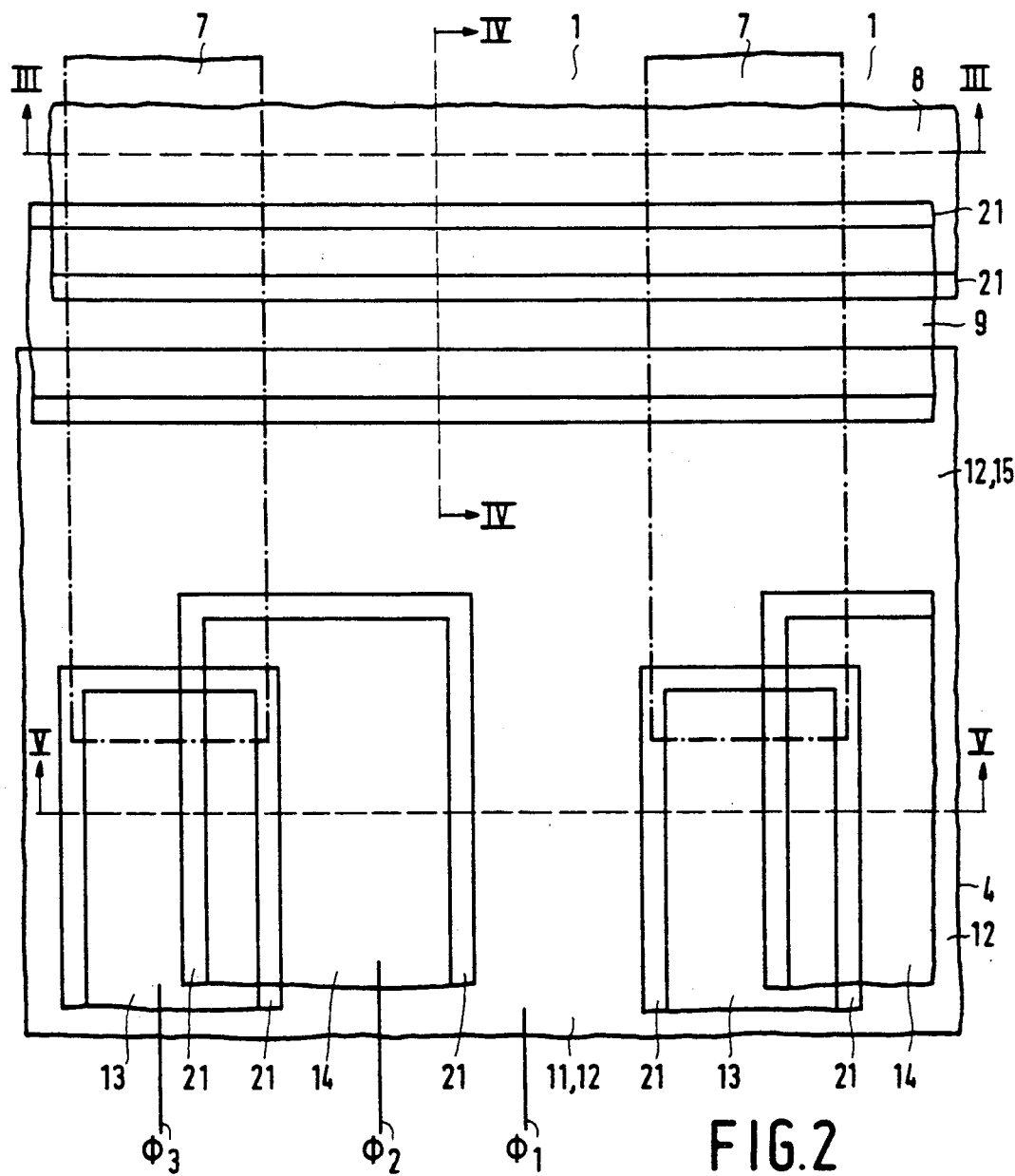
FIG. 2 is a plan view of the parallel-serial transition of this device.

To achieve the highest possible horizontal resolution, the pitch between the channels 1 is very small, for example, approximately 6 microns. Given these small dimensions, it is usual to provide two or three horizontal registers 4, so that a greater pitch in the readout register is possible. In the device according to the invention, the horizontal register has a design which renders possible the use of a single register, while an efficient parallel-serial transport is maintained. FIG. 2 shows in its top half a portion of the memory section 3 and in the bottom half an adjoining portion of the serial output register 4. Only one channel of the parallel channels 1 is represented in its full width, bounded on the left and right by limitation zones 7. At the right-hand edge of the drawing an adjacent channel 1 is also partly shown. The limitation zones 7 are indicated in the drawing with dash-dot lines. The Figure further shows the last charge storage gate 8 and a transfer gate 9.

The horizontal output register 4 in the present embodiment is formed by a 3-phase CCD, which means that, if there is a pitch of 6 microns between the limitation zones 7, there are three clock electrodes of the serial register 4 to be made within an area of 6 microns. The clock electrodes are constructed in a multilayer wiring system, in this example a 3-layer wiring of polycrystalline silicon. This renders it possible to provide each of the 3 phases in a layer. The wiring layers are indicated with poly 1, poly 2, and poly 3 hereinafter for the sake of brevity, the word poly being short for polycrystalline silicon and the numbers behind the word poly giving the sequence in which the various poly layers are provided. According to the invention, the clock electrodes 11, which are situated in poly 3, i.e. the uppermost poly layer which was provided last, form part of a continuous conductor layer 12 which extends not only at the area of the clock electrodes 11 over the CCD channel, but also over the other clock electrodes, by which it is separated from the channel, so that it is not active as an electrode at the areas of these other electrodes. As can furthermore be seen in the plan view of FIG. 2, each of the limitation zones 7 is associated with a clock electrode 13 which is provided in poly 1, i.e. The lowest poly layer provided first. The electrodes 13 belong to a same phase, in the example to φ-3, so that the same voltages are always applied to these electrodes during operation. The electrodes 13 lie in the extended direction o the limitation zones 7, seen in plan view, and have a width (seen in the horizontal charge transport direction) which is at most equal to the width of the limitation zones 7. Between the electrodes 11 and the electrodes 13 are situated the electrodes 14 which are formed in the poly-2 layer and belong to the φ-2 phase.

Since the electrodes 13 are not wider than the zones 7, it can be prevented that during the parallel-serial transport, when the electrodes 13 are set at a blocking voltage level and the electrodes 11 and 14 at an active voltage level, a potential barrier is formed in the serial register, seen from the parallel section, owing to narrow-channel effects. The occurrence of such a barrier could result in charge being left behind in the parallel section. By forming the electrodes 13 in poly 1, while no other electrodes are present yet at the surface, it is possible to obtain a high accuracy during their manufacture, at least a higher accuracy than if the electrodes 13 were formed in poly 2 or poly 3, thanks to the fact that the structure in that stage is still comparatively plane. The provision of the electrodes 11 is fairly easy in that these electrodes are provided in the uppermost conductor layer poly 3 as a continuous layer, in spite of the fact that the structure in that stage of the process is no longer plane, so that the manufacture of very fine patterns would be difficult or even almost impossible.

Figure 4:
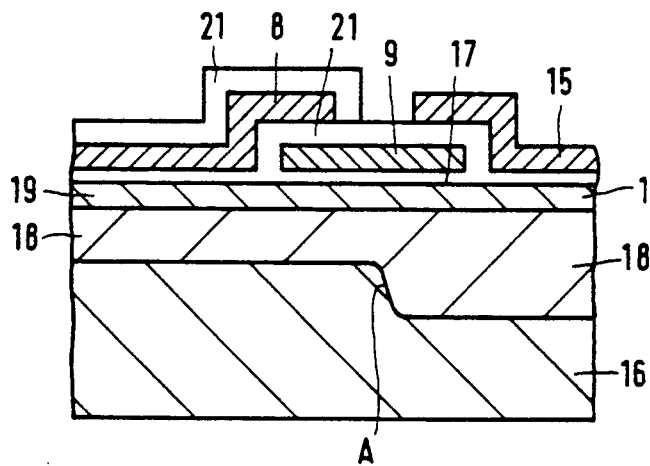
FIG. 4 is a cross-section of this device taken on the line IV—IV.

As the plan view of FIG. 2 and the cross-section of FIG. 4 show, the layer 12 comprises a portion 15 which is situated over a portion of the parallel section which adjoins the serial register 4 and extends between the limitation zones 7. The portion 15 overlaps the transfer electrode 9, which is preferably manufactured in poly 1 for reasons explained below. The last charge storage electrode 8 of the parallel section 3, which also overlaps the transfer electrode 9 and is preferably not formed in the same poly layer as the conductor track 11, 12, 15, since this would impose restrictions on the desired width of the gate 9, is manufactured in poly 2.

Figure 3:
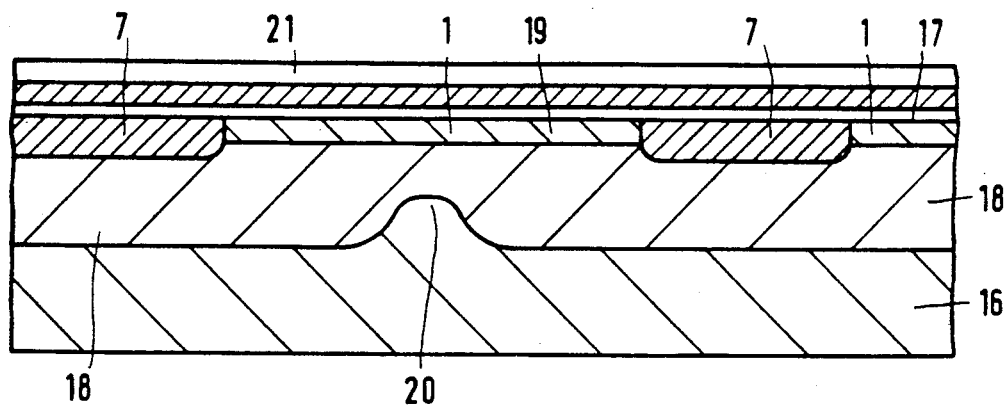
FIG. 3 is a cross-section taken on the line III—III in FIG. 2.

In the present embodiment, the semiconductor body 16 comprises an n-type silicon substrate which is provided with a p-type surface zone or well 18 at the surface 17. The vertical channels 1 and the horizontal register channel 4, which are of the buried n-channel type, each comprise an n-type zone 19 which is separated from the n-type substrate 16 by the p-type surface zone 18. The limitation zones 7 in this example are formed by p-type zones with a higher doping concentration than the p-type well 18. Obviously, the zones 7 may also be obtained in a different manner, for example, through thick oxide or by means of a field plate. The p-type well 18 shows a constricted portion 20 (see FIG. 3) below the vertical channels 1. As is described inter alia in the IEDM publication of December 88 referred to above, any excess of generated electrons in the case of local overexposure in the sensing section in this configuration can be drained off to the n-type substrate. This method is known in the literature as vertical anti-blooming, sometimes abbreviated to VAB. According to a known method of obtaining the construction 20, the zone 18 is formed in that mask-defined sub-zones are made to diffuse towards one another in lateral direction by a heating step until a continuous p-type zone 18 with the constrictions 20, where the subzones overlap, is formed. To prevent loss of charge in the serial register 4, the p-type zone 18 is formed by a homogeneous, continuous zone without constriction at the area of the serial register. The transition from a non-homogeneous p-zone to a homogeneous p-zone is represented in FIG. 4 at point A. The deep p-type zone to the right of A corresponds to an extra quantity of negative charge. This extra charge will cause a potential barrier in the n-type buried channel below electrode 9, for example, when equal voltages are applied to the electrodes 8, 9 and 15. The influence of this barrier on the charge transport may be eliminated by choosing the length of the electrode 9 to be so small that the electric fields induced in the channel 1 by the electrodes 8 and 15 penetrate to approximately halfway the electrode 9 (fringing fields). By the application of a suitable voltage to the electrode 9 during operation it is possible to obtain a monotonically changing field below the electrode 9 without potential wells or barriers. Since the electrode 9 must be narrow, it is advantageous to construct this electrode in poly 1. If, as in the example described here, the last charge storage electrode 8 of the memory section is made in poly 2 in such a way that there is an overlap with electrode 9, the electrode 15, which also overlaps electrode 9, is preferably made in poly 3.

The various poly layers are electrically insulated from one another by means of dielectric layers 21 of, for example, silicon oxide or other suitable materials which are known per so.

Figure 5:
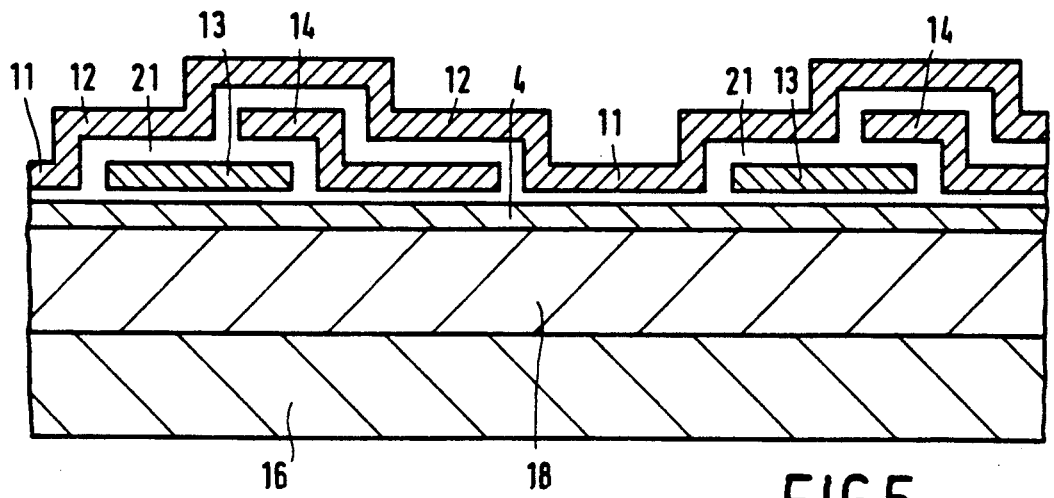
FIG. 5 is a cross-section of the same device taken on the line V—V in FIG. 2.
Figure 6:
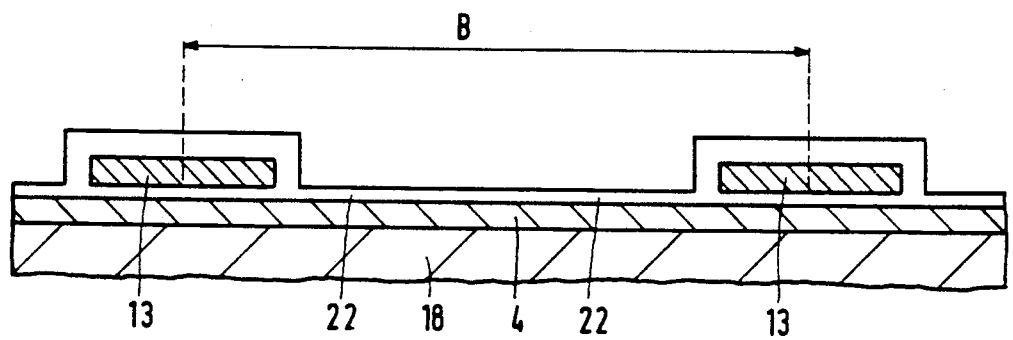
FIGS. 6 and 7 show the same cross-section as FIG. 5 during the manufacture of the device.
Figure 7:
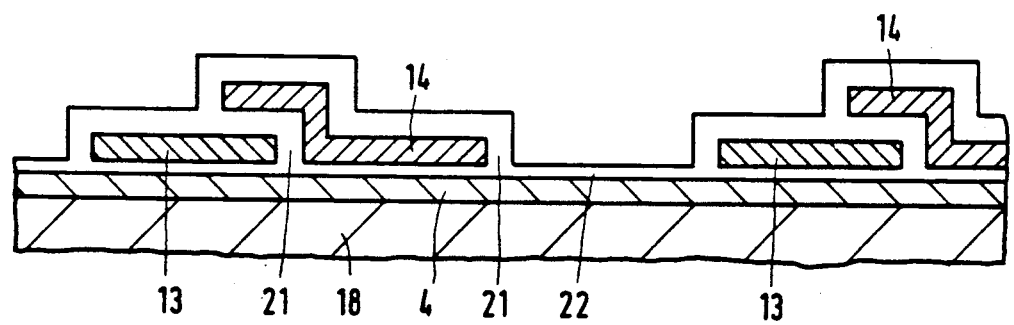

The device can be manufactured by techniques which are known per so. In FIGS. 6-7, the serial register in the cross-section according to FIG. 5 is shown in several stages of manufacture to illustrate the dimensions which can be realized in an image sensor according to the invention. It is assumed that the pitch between the channel limitation zones 7 is approximately 6 micrometers and that the width of the regions 7 is approximately 2 microns. The width of the vertical channels 1 then is 4 microns. In FIG. 6, the pitch between the limitation zones 7 is indicated with B. First the electrodes 13 are provided in the poly 1 layer on the gate oxide 22 covering the surface 17 and in line with the limitation zones 7. The width of the electrodes 13 is approximately 1.75 microns, the thickness of the oxide layer 21 covering the electrodes 13 is approximately 0.25 microns. The spacing between the poly tracks 13 for growing the oxide 21 is approximately 4 microns, which in this stage is still sufficient for the available auxiliary means. In a next stage, the poly 2 layer is provided by deposition, and the electrodes 14 are formed therefrom by etching. The active portions of these electrodes, i.e. The portions lying directly on the gate oxide 22, are also approximately 1.75 microns wide. The thickness of the oxide 21 covering the electrodes 14 is approximately 0.25 micron. The active portion of the electrodes 14 accordingly is at least substantially equally large as that of the electrodes 13 in poly 1. Since the electrodes 14 in poly 2 overlap the electrodes 13, so that the total width of the electrodes 14 becomes greater, the openings between the electrodes 14 compared with the electrodes 13 are approximately 1 micron smaller. In a next stage of the process, in which the structure has now become highly profiled owing to the poly 1 and 2 layers, the third poly layer, poly 3, is deposited. Since the electrodes in poly 3 must overlap the electrodes 13 and 14, the openings between the electrodes would become very small.

It will be clear that the invention is not limited to the embodiment described here, but that many variations are possible to those skilled in the art. Thus the invention may be used for other types of image senors which are known per se, such as interline sensors or interline sensors with raster memories. The invention may also be advantageously applied to SPS memories and in general to any type of CCD delay line with parallel inputs.

I claim:

1. A charge-coupled device comprising a semiconductor body with, at a surface, a parallel section of parallel channels situated next to one another and a parallel-in/serial-out serial register coupled thereto, the parallel channels being mutually separated by limitation zones which extend between the parallel channels up to the serial register, while the serial register is provided with a system of clock electrodes constructed in an m-layer multi-layer wiring system, characterized in that the clock electrodes provided in the $m^{th}$, uppermost wiring layer belong to a common phase of the serial register and form part of a continuous conductor layer which extends over the entire width of others of said clock electrodes in the direction of said serial register and is insulated therefrom, and in that a clock electrode is associated with each of the said limitation zones, which clock electrode is provided in the first, lowermost wiring layer and which, as viewed at the surface, lies in the width extension of the limitation zone and thus has a width which is at most equal to the width of the limitation zone, each of said clock electrodes in the first wiring layer also belonging to a common phase of the serial register.

2. A charge-coupled device as claimed in claim 1, characterized in that the continuous conductor layer in the uppermost wiring layer comprises a portion which is situated above a portion of the parallel section adjoining the serial register.

3. A charge-coupled device as claimed in claim 1, characterized in that the serial register is an m-phase multi-phase device in which clock electrodes which are provided in a common wiring layer belong to a same phase.

4. A charge-coupled device as claimed in claim 3, characterized in that the serial register is a 3-phase device and that the clock electrodes of the serial register are provided in a 3-layer wiring system.

5. A charge-coupled device a claimed in clam 1, characterized in that the clock electrodes of the serial register are made of polycrystalline silicon.

6. A charge-coupled device as claimed in claim 1, characterized in that the parallel section and the serial register form part of an image sensing device.

* * * * *